United States Patent
Chang et al.

(10) Patent No.: US 7,219,275 B2
(45) Date of Patent: May 15, 2007

(54) METHOD AND APPARATUS FOR PROVIDING FLEXIBLE MODULAR REDUNDANCY ALLOCATION FOR MEMORY BUILT IN SELF TEST OF SRAM WITH REDUNDANCY

(75) Inventors: Tom Y. Chang, Fishkill, NY (US); William V. Huott, Holmes, NY (US); Thomas J. Knips, Wappingers Falls, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 11/053,631

(22) Filed: Feb. 8, 2005

(65) Prior Publication Data

US 2006/0179368 A1 Aug. 10, 2006

(51) Int. Cl.
*G11C 29/00* (2006.01)
*G01R 31/28* (2006.01)

(52) U.S. Cl. ...................... 714/718; 714/733
(58) Field of Classification Search ............... None
See application file for complete search history.

(56) References Cited

U.S. PATENT DOCUMENTS

| | | | |
|---|---|---|---|
| 5,337,318 A | 8/1994 | Tsukakoshi et al. | 371/5.5 |
| 5,535,164 A | 7/1996 | Adams et al. | 365/201 |
| 5,633,877 A | 5/1997 | Shephard, III et al. | 371/22.2 |
| 5,790,559 A | 8/1998 | Sato | 371/21.3 |
| 5,859,804 A | 1/1999 | Hedberg et al. | 365/201 |
| 5,961,653 A | 10/1999 | Kalter et al. | 714/7 |
| 6,185,709 B1* | 2/2001 | Dreibelbis et al. | 714/726 |
| 6,321,320 B1* | 11/2001 | Fleischman et al. | 711/217 |
| 6,373,758 B1* | 4/2002 | Hughes et al. | 365/200 |
| 6,594,788 B1 | 7/2003 | Yasui | 714/710 |
| 2002/0157051 A1* | 10/2002 | Eckelman et al. | 714/736 |

OTHER PUBLICATIONS

U.S. Appl. No. 10/814,719, filed on Mar. 31, 2004.

* cited by examiner

*Primary Examiner*—Phung My Chung
(74) *Attorney, Agent, or Firm*—Cantor Colburn LLP

(57) ABSTRACT

A method and apparatus for providing flexible modular redundancy allocation for memory built in self test of random access memory with redundancy. The apparatus includes a first redundancy support register that includes inputs for receiving an address of a location in memory under test and data relating to must fix repair elements. The address includes a row and column vector of the location. The first redundancy support register also includes outputs for transmitting the address and data. The apparatus also includes a second redundancy support register including inputs for receiving the address and data from the outputs of the first redundancy support register. Each of the inputs of the second redundancy support register shares a one-to-one correspondence to each of the outputs of the first redundancy support register. The apparatus further includes allocation logic for providing a modular implementation of the first redundancy support register and the second redundancy support register.

16 Claims, 6 Drawing Sheets

METHOD AND APPARATUS FOR PROVIDING FLEXIBLE MODULAR REDUNDANCY ALLOCATION FOR MEMORY BUILT IN SELF TEST OF SRAM WITH REDUNDANCY

BACKGROUND OF THE INVENTION

1. Field of the Invention

This invention relates to integrated circuit chip testing, and more particularly, to flexible modular redundancy allocation logic for memory built in self test of SRAM with redundancy.

2. Description of Background

In order to test random access memory (RAM) macros, e.g., static random access memory (SRAM) macros with redundant elements for failure relief, by means of Array Built In Self Test (ABIST), the data from the array is usually compared to expected data generated by the self test ABIST function. To this end, the ABIST circuitry is used for vector generation of address and data, and subsequent comparison circuitry is used to provide a bit wise fail vector corresponding to each of the data outs of the memory array, or device under test. This additional circuitry is either embedded in the SRAM or provided in surrounding logic.

This fail vector, or the situation of determining that a fail has occurred, is then processed to determine whether the failure can be repaired using the redundant elements/circuitry of the memory array under test. This processing for establishing the redundant element configuration for failure relief is traditionally handled "off-chip" by various test equipment apparatus and peripheral computer software analysis of the component under test as described in U.S. Pat. No. 6,594,788 issued on Jul. 15, 2003, entitled "Method of Analyzing a Relief of Failure Cell in a Memory and Memory Testing Apparatus Having a Failure Relief Analyzer Using the Method"; and U.S. Pat. No. 5,790,559 issued on Aug. 4, 1998, entitled "Semiconductor Memory Testing Apparatus."

Similarly, apparatus involving large memory storage (e.g., storage equal to the target memory array) can be used to support memory integrated circuit (IC) testing with redundant circuits as described in U.S. Pat. No. 5,337,318 issued on Aug. 9, 1994, entitled "Memory IC Testing Apparatus With Redundancy Circuit", and which recites an apparatus for processing and determining repairability of a target memory array.

The memory array redundant elements can be provided in a plurality of configurations, usually based on the overall size of the memory array macro, addressing configuration, and the number of data outs provided. Memory arrays can be viewed as three dimensional binary storage elements: considering a row dimension and a column dimension to describe an array of memory cells, and this array of cells can be replicated to provide for a plurality of data input/output bits, each composed of the two dimensional array of memory cells. To generalize the categories for background purposes here, DRAM macros (due to the high number of memory bits) will usually contain a plurality of column and word addressable redundant elements. That is, both spare rows of memory cells and spare columns of memory cells are provided for relief of manufacturing defects, each spanning the total number of data input/output pins for the memory array. SRAM macros are generally smaller in total size and, due to the larger memory cell requirements, are generally provided fewer spare elements, although these elements may be provided as both column and row addressable elements. In fact, due to generally fewer column addressable elements of a high speed SRAM macro, column addressable spare or redundant elements become costly in terms of the overall number of memory array cells. Therefore a secondary scheme of column spare elements can be provided by providing spare data inputs/outputs or some fraction of a data bit group of cells, as disclosed in patent application Ser. No. 10/814,719 entitled "Skip Over Redundancy Decode with Very Low Overhead", filed on Mar. 31, 2004, and which is incorporated by reference herein in its entirety. A more general case is to reduce the number of repair actions, or to limit the redundant elements to a single dimension of row addressable or column addressable elements only.

The support for two dimensional redundancy allocation is described in U.S. Pat. No. 5,859,804 issued on Jan. 12, 1999, entitled "Method and Apparatus for Real Time Two Dimensional Redundancy Allocation", which discloses an array built in self test (ABIST) system disposed on a single semiconductor chip. The chip provides a memory array having a plurality of column lines and a plurality of row lines and at least one redundant column line and at least one redundant row line with cells coupled to the lines at intersections thereof. This patent thus describes a method and apparatus provided in an array built in self test (ABIST) environment formed on the semiconductor chip having an array of memory cells arranged in columns and rows and column and row redundant lines which includes testing the array along the columns to identify a given number of faulty cells in each of the columns, storing the column addresses having the given number of faulty cells in first registers, further testing the array along the columns or rows to identify any additional faulty cells while masking the cells having the stored column addresses and storing the row addresses having the faulty cell in second registers until all of the second registers store row addresses, and after all of the second registers store row addresses, continue testing the array while masking the cells having the stored column or row addresses and storing the column addresses of any remaining additional faulty cell in any unused register of the first registers.

What is needed, therefore, is a way to reduce the complexity of the logic and process to establish a repairable configuration of a memory array with redundant elements, thereby reducing the test time and cost required. What is further needed is a way to reduce the circuit overhead of the test compare and processing for establishment of the redundant element configuration for failure relief of memory arrays with redundant circuits.

SUMMARY OF THE INVENTION

The shortcomings of the prior art are overcome and additional advantages are provided through the provision of a method and apparatus for providing flexible modular redundancy allocation for memory built in self test of random access memory with redundancy. The apparatus includes a first redundancy support register that includes inputs for receiving an address of a location in memory under test and data relating to must fix repair elements. The address includes a row and column vector of the location. The first redundancy support register also includes outputs for transmitting the address and data. The apparatus also includes a second redundancy support register including inputs for receiving the address and data from the outputs of the first redundancy support register. Each of the inputs of the second redundancy support register shares a one-to-one correspondence to each of the outputs of the first redundancy support register. The apparatus further includes allocation logic for providing a modular implementation of the first redundancy support register and the second redundancy support register.

Methods corresponding to the above-summarized apparatus is also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The apparatus of the invention integrates a redundancy allocation register and associated compare logic (also referred to herein as redundancy support register modules) that is used as a base element or module to capture failures from a memory array under test. In accordance with exemplary embodiments, the redundancy support register is initially non-specific as to the type of repair (e.g., row or column) that may eventually be required, and for the defect case in the memory array where the failing region is contained within the intersection of possible spare row elements and spare column elements, it is sufficient to only store the address of the intersection.

The redundancy allocation register also contains marker bits and compare logic used in comparing its contents to the address of subsequent fails from the memory array, for the purpose of ascertaining uniqueness and/or congruence of the fails. Establishing uniqueness will result in subsequent redundancy allocation modules to be loaded with the fail. A non-unique fail refers to a current fail that is wholly contained within the intersection of the stored element address. Congruency establishes whether subsequent fails are contained in the same column or row as the original or previous fail. A positive congruency determination results in the setting of appropriate markers (e.g., must fix row or must fix column). These modules can then be stacked to accumulate a plurality of failing areas of the memory array under test without requiring any pre-screening or multi-dimensional counters for accumulating fails.

The apparatus of the invention, when combined with a traditional self test engine (e.g., ABIST) used for test vector generation of address and data, and subsequent comparison circuitry used to provide a bit wise fail vector corresponding to each of the data outs of the memory array (or device under test), provides a built-in, on-chip in-situ at speed test system for testing a memory array with redundancy circuits for failure relief.

Figure 1:
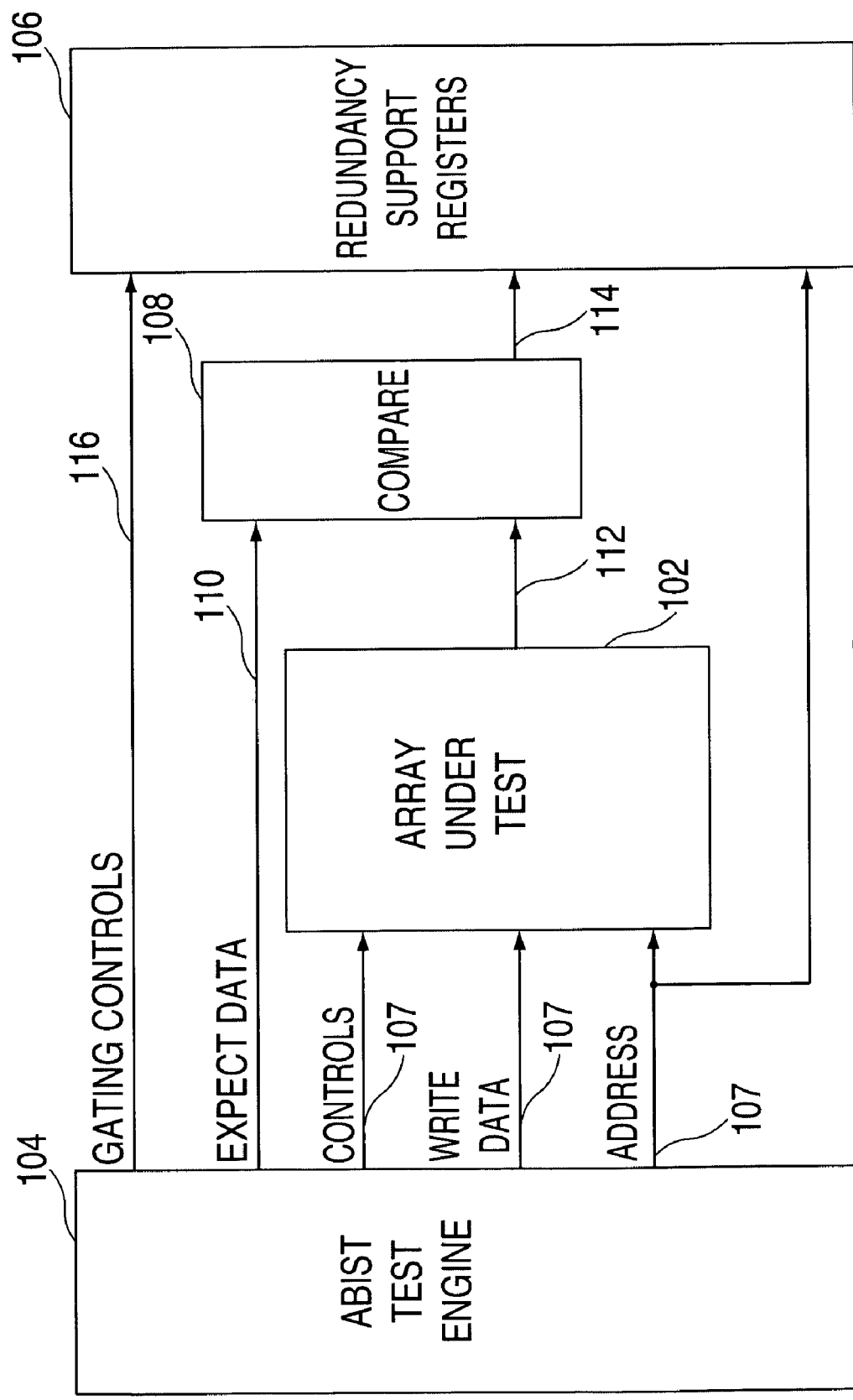
FIG. 1 illustrates a typical ABIST implementation represented by memory array test system support elements and its configuration in the prior art.

FIG. 1 shows a typical ABIST implementation represented by memory array test system support elements and their configuration. The redundancy allocation support described herein is, but not restricted to, two dimensional in reference to the row and column addressing within the structure of the memory array 102 under test. There may exist a plurality of redundant row and column elements thus supported by the redundancy support registers 106. The self test engine 104 provides the deterministic array test patterns 107. The compare function 108 has as its inputs, the expected data vector 110 and the memory array outputs 112. It provides an overall pass/fail result signal 114 which is used in combination with the gating controls 116 from the self test engine 104 to control the redundancy support registers 106 in establishing real time redundancy allocation.

Figure 2:
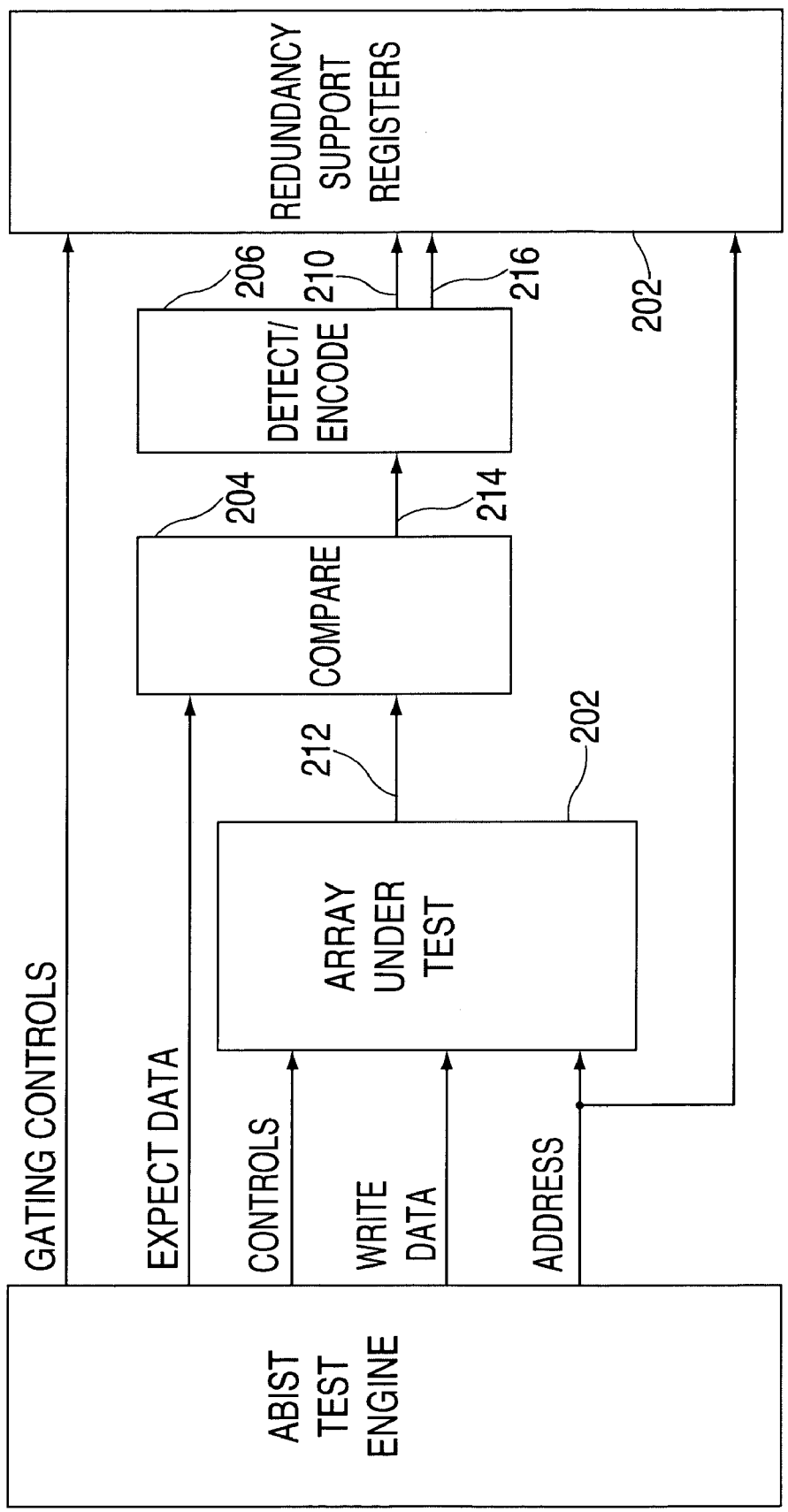
FIG. 2 illustrates another variation of an ABIST element configuration in the prior art which includes elements used in support of two dimensional memory array redundancy allocation.

FIG. 2 shows another variation of an ABIST element configuration with support elements used again, but not restricted to, in support of two dimensional memory array redundancy allocation. The exception here, is that there may exist a plurality of row and, what will be referred to herein as, column group elements within the memory array structure 202. These column group elements are not selected by memory array column addressing alone, but instead coincide with a data input/output element in whole or in part.

In the configuration shown in FIG. 2, one of the redundant/repairable element dimensions corresponds to an array input/output (I/O) in whole or in part. The compare element 204 no longer compresses the test result to a single pass/fail signal 114, but instead provides individual result signals 214 for each memory array data out 212. The detect/encode circuit element 206 is thus employed to determine memory array fail repairability, first by signaling that one and only one repairable element is failing and then providing an encoded representation 210, or "effective" address to be processed by the two dimensional redundancy support register 208. Again, not all memory array addressing bits may be needed by the redundant element allocation register 208, only those sufficient to uniquely describe/address the redundant element invocation.

Figure 3:
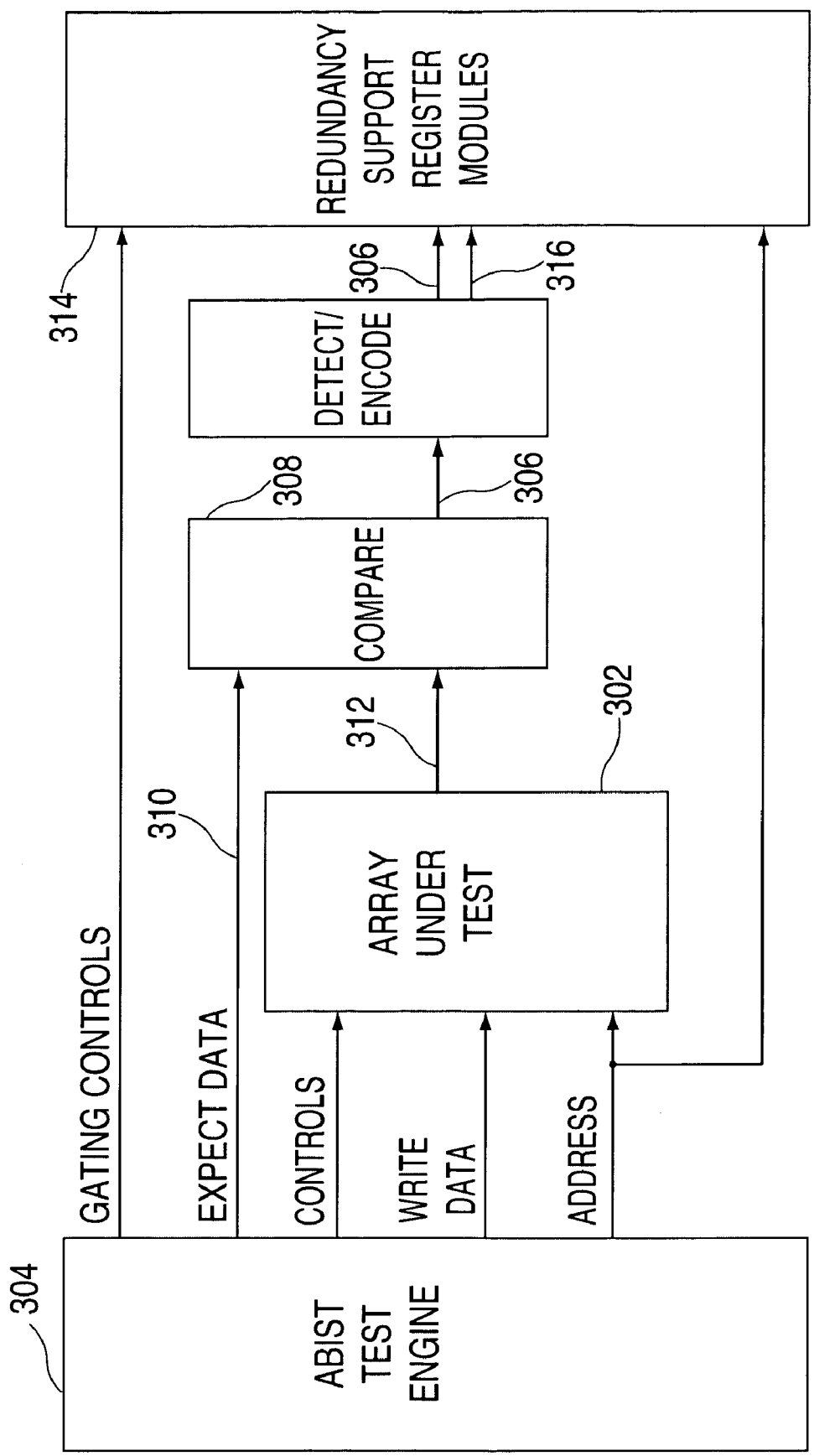
FIG. 3 illustrates an ABIST element configuration including redundancy support register apparatus in exemplary embodiments.

In accordance with exemplary embodiments, an ABIST element configuration including redundancy support register apparatus is shown in FIG. 3. The preferred embodiment of the invention will be described herein with relation to existing ABIST implementations, such as those described in patents mentioned below and incorporated herein by reference in their entireties, including U.S. Pat. No. 5,633,877 (Huott) entitled "Programmable Built-In Self-Test Controller for Arrays", and U.S. Pat. No. 5,961,653 (Kalter et al) entitled "Processor based BIST for an Embedded Memory" issued Oct. 5, 1999, and U.S. Pat. No. 5,535,164 (Adams), entitled "BIST Tester for Multiple Memories", issued on Jul.

9, 1996, and will further reference this as the ABIST test engine wherein Kalter et al. describes an integrated chip having a DRAM embedded in logic is tested by an in-situ processor oriented BIST macro. The BIST is provided with two ROMs, one for storing test instructions and a second, which is scannable, that provides sequencing for the test instructions stored in the first ROM, as well as branching and looping capabilities. The BIST macro has, in addition, a redundancy allocation logic section for monitoring failures within the DRAM and for replacing failing word and/or data lines. By stacking the DRAM in 0.5 mb increments up to a 4.0 mb maximum or in 10.0 mb increments up to an 8 mb maximum, all of which are controlled and tested by the BIST macro, a customized chip design with a high level of granularity can be achieved and tailored to specific applications within a larger ASIC.

The ABIST compare function 308 may be used to implement an N-bit compare of the data out buss 312 of the memory array macro 302 (e.g., dataouts 0:N) and the expect data buss 310 (e.g., 0:N) from ABIST test engine 304. Overall ABIST error detection may then be accomplished as an N-way logical 'OR' determining if any mis-compare has occurred on a cycle-by-cycle basis. The error signal, or mis-compare, is also referred to as an 'rtfail' or real time fail signal. For memory array applications with two dimensional redundancy, whereby one dimension is in terms of row addressing, and the second dimension is in terms of column addressing across one or all data bits of the memory array, then this compare result buss 306 or overall error detection provides for a sufficient determination of a fail and location for purposes of result propagation to the redundancy support register apparatus 314.

For memory array applications with two dimensional redundancy, whereby one dimension is in terms of row addressing, and the second dimension is in terms of column addressing and/or all or part of a memory data out (herein referred to as a column group), then the compare result buss 306 and overall error detection needs additional processing similar to that described in FIG. 2 in order to provide for a sufficient determination of a fail and location for purposes of result propagation to the redundancy support register apparatus 314. This additional processing may take the form of detection if one or more of the memory data outs are failing, and the encode of the failing data out bits to a reduced form of binary address representation of the failing data out. If the number of simultaneously failing data outs exceed the number of column group repairable or redundant elements provided within the memory array 302, then an additional signal 316 is asserted, herein referred to as the multi-bit or 'must fix row' signal.

Figure 4:
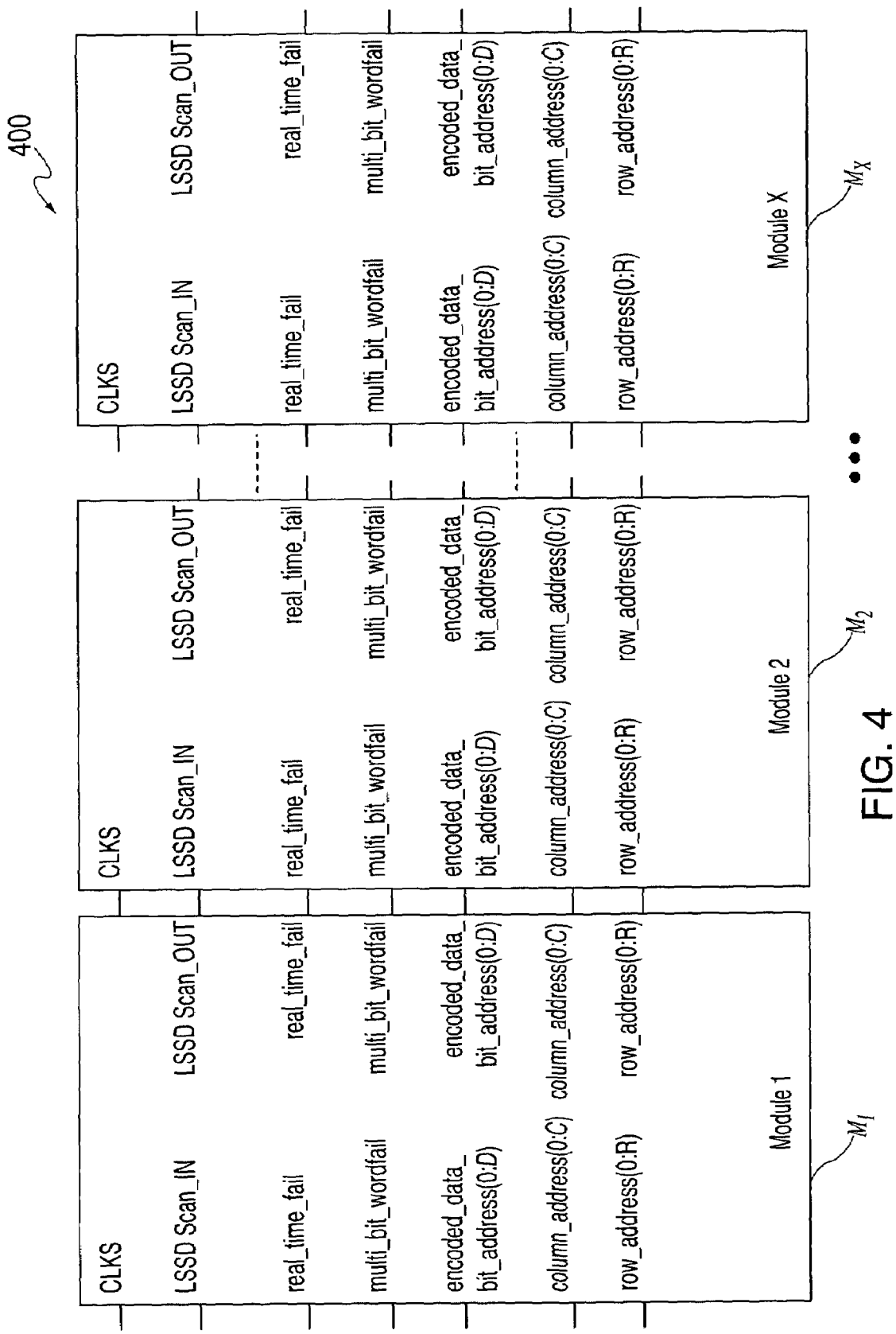
FIG. 4 illustrates a grouping of the redundancy support register modules and its elements in exemplary embodiments.

Turning now to FIG. 4, a redundancy support register apparatus 400 comprising a grouping of redundancy support register modules including interface connections will now be described. As shown in FIG. 4, the redundancy support register apparatus comprises modules $M_1$–$M_x$, where X refers to the number of redundant elements provided within the memory array, although it is not restricted to this number (e.g., additional modules may be used for data collection and semiconductor memory array yield management and diagnostics, etc.).

To this point, it has been detailed that the following information is available as input to the redundancy allocation logic of a redundancy support register: overall fail signal or 'real time fail' signal, multi-bit or 'must fix row' signal if required, the pipelined address of the location under test within the array structure from the ABIST test engine, and the 'encoded' address of the failing data out from the ABIST compare function. It will be understood that the pipelined address signal buss referenced is composed of both row addressing signal vectors (defined here as 0:R) and column addressing signal vectors (0:C). This differentiation in the row and column address vectors will be used in separate compare structures within the redundancy allocation logic.

Similarly, the outputs of the redundancy allocation logic of the first redundancy support register module $M_1$ are such that there exists a one-to-one correspondence with the inputs: a fail signal or 'real time fail' signal, multi-bit or 'must fix row' signal, the address of the location under test, and the 'encoded' address of the failing data out from the ABIST compare function. Therefore, it will be demonstrated that the redundancy allocation logic proposed here in exemplary embodiments is implemented as modular redundancy support registers, and as such can be so stacked, or chained together to form a plurality of configurations as deep as required by the memory array redundant elements, or supplemented to provide additional diagnostic information regarding failure relief for the memory array under test. This modular configuration of the redundancy support registers also allows for pipeline registers in between modules for very high performance, and reducing the overall complexity of two dimensional redundancy allocation logic associated with prior art solutions.

The redundancy support modules are structured to provide for storage of the full address of the memory array location under test, the encoded address representation of the failing data bit, a load or enable bit that marks the register entry as used, and two additional marker bits within the register to provide for "must fix" information as to the nature of the failure relief required within the memory array, i.e., either a must fix column element repair is required, or a must fix row element repair is required. If neither of these marker bits are set during the course of the testing procedure, and the module is loaded with an address entry relating to a failure within the memory array requiring relief, the flexibility is maintained for future calculation of the overall redundancy repair solution of the memory array, and either dimensional repair can be invoked to obtain relief, without prior allocation from this apparatus to restrict subsequent failure relief within the memory array.

Figure 5:
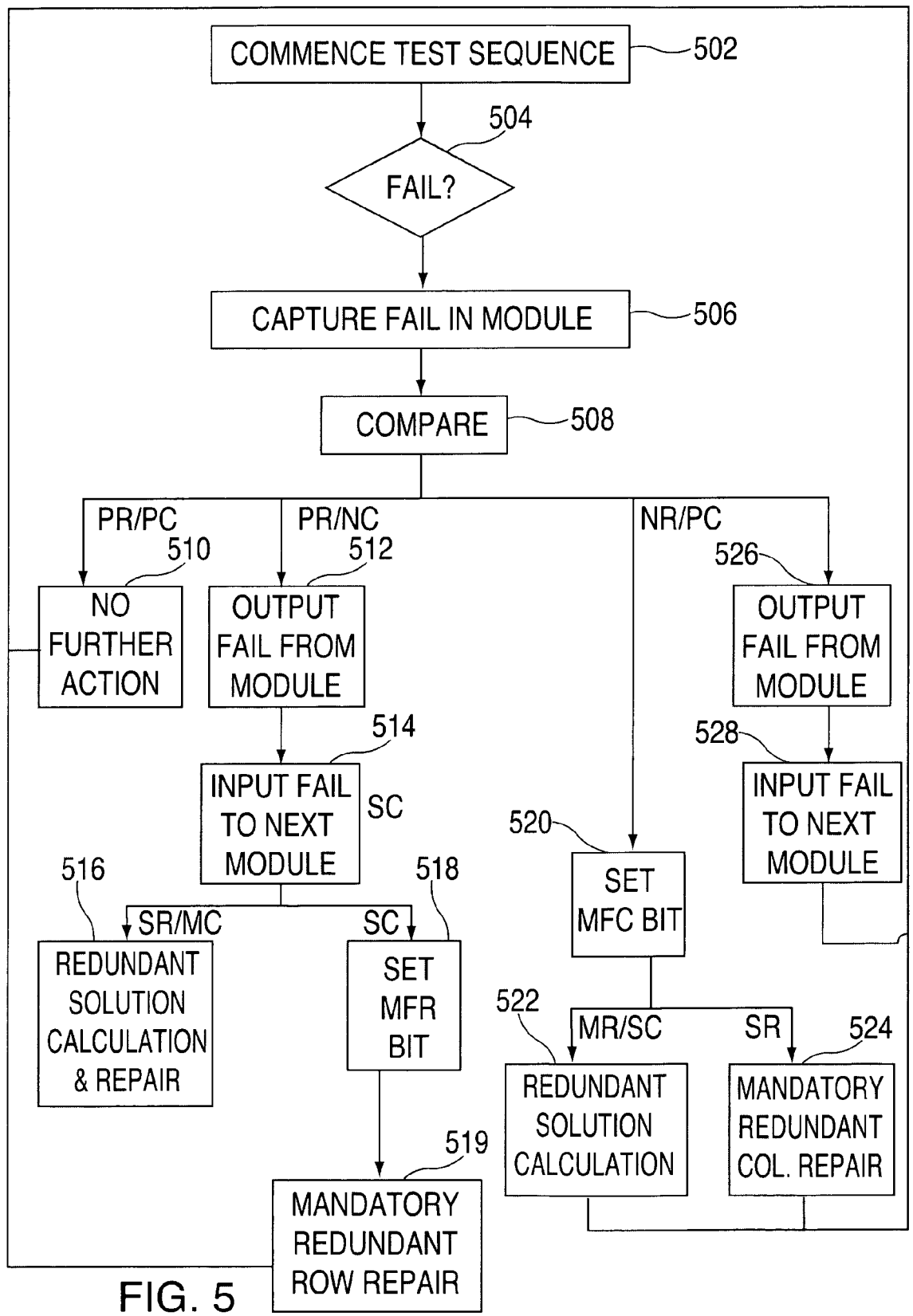
FIG. 5 is a flow diagram describing a process for implementing the redundancy support register apparatus in exemplary embodiments.

To examine the operation of the redundancy support register (or module) and its associated redundancy allocation logic, an overview of the operation of an embodiment or implementation containing several modules is presented and described in the flow diagram of FIG. 5. The redundancy allocation logic allows for an incoming fail from the ABIST test of the memory array to be fully captured in the first module or register (e.g., $M_1$) of the proposed function. Any subsequent failures during the ABIST test, whether due to the same failure during a repetitive access of the defective location or from other defective memory array locations that are activated during the course of the testing sequence are then presented to this first redundancy support register for comparison to its contents. This subsequent, or new, failure is compared to the first stored failure to determine if it is contained within a row repairable element (redundant elements are not restricted to a single row but may span a plurality of rows). Comparison is also made to determine if the incoming failure is contained by or compares to the first failure in terms of the column repairable element (a redundant column element is not restricted to a single column, but may span a plurality of columns).

Turning now to FIG. 5, a process for implementing the redundancy support register modules in exemplary embodiments will now be described. A testing sequence is commenced by test engine 304 at step 502. The results of the testing are compared in order to determine if a fail has occurred. If a fail has occurred at step 504, the fail data is captured in the first redundancy support register module $M_1$ at step 506 and the process continues whereby additional testing is performed. If a fail has not occurred, the testing continues. Upon detecting a second fail at step 504, the second fail is presented to the first redundancy support registry module M1 at step 506. The two fails are compared at step 508.

Given positive results of these comparisons, that the incoming fail is contained within the area of the intersection of a redundant row and redundant column element, then the stored value is sufficient to relieve the failure of the memory array, and no further action is taken, i.e., no further redundancy support registers are loaded at step 510.

Given a positive result of the row address comparison, but a negative result for the column address (column and/or data out) indicates that the incoming fail is along the same row repairable element but spans multiple column repairable elements. In the general case, this preferred embodiment would provide for enabling the fail output of the redundancy allocation logic at step 512, directing the new incoming fail to be loaded into the second redundancy support register at step 514. This is proposed sufficient to enable a redundancy solution calculation for failure relief within the memory array based on either a single row element replacement, or multiple column element replacement to correct the defect situation within the memory array. In the specific case that only a single column repairable element is provided within the memory array, then the row element defect matching case is sufficient to set the aforementioned "must fix" row marker bit at step 518, yielding a mandatory redundant row repair element replacement of the memory array for failure relief at step 519. In the case that the incoming fail also has a multi-bit or multi-bit wordfail (signal 316), asserted high, indicating the number of simultaneously failing data outs exceed the number of column group repairable or redundant elements provided, then the "must fix" row marker bit is set upon the initial load of the redundancy support register module. When an incoming fail also having signal 316 asserted, and having a positive result of the row address comparison to an already loaded register, then the "must fix" row marker bit of the already loaded register is set, and no further redundancy support registers are loaded for this fail.

Given a positive result of the column address comparison, but a negative result for the row address then the incoming fail is along the same column repairable element but spans multiple row repairable elements. In this case, this preferred embodiment would provide for enabling the "must fix" column marker bit at step 520, indicating that a column repair element is required for failure relief of the memory array. It is not restricted that the embodiment would instead enable the fail output of the redundancy allocation logic, directing the new incoming fail to be loaded into the second redundancy support register. This is proposed sufficient to enable a redundancy solution calculation for failure relief within the memory array based on either multiple row element replacement, or a single column element replacement to correct the defect situation within the memory array at step 522. In the specific case that only a single row repairable element is provided within the memory array, then the column element defect matching case is sufficient to set the aforementioned "must fix" column marker bit, yielding a mandatory redundant column repair element replacement of the memory array for failure relief at step 524.

Given negative results of both the row address comparison and for the column address (column and/or data out) comparison, then the incoming fail is fully disjoint to the stored failure. In this case, the preferred embodiment would provide for enabling the fail output of the redundancy allocation logic at step 526, directing the new incoming fail to be loaded into the second (or subsequent) redundancy support register(s) at step 528.

As described for operation of the first proposed redundancy support register module, and associated redundancy allocation logic, subsequent registers are chained together forming a complete system of redundancy allocation modules that operate in the same fashion, as shown in FIG. 4. Any of the failures encountered during ABIST test of the memory array structure are consistently handled in a similar fashion. The first fail is always loaded to the first register. All subsequent fails are processed and compared to this first register entry. Any fails disjoint to the first entry are then passed to the second entry. All fails passed to the second entry are processed and compared to the second register entry. Any fails disjoint to the second entry are then passed to the third entry. All fails are sequentially processed through the register entries providing for a comprehensive accrual of all memory array defects requiring failure relief. Therefore, the process depicted in FIG. 5 represents the activity within a redundancy allocation module, and is repeated, or re-entered for each module, as shown in FIG. 4, up to module Mx (400).

In exemplary embodiments, the storage of the failure locations in the redundancy support modules are available for retrieval via direct read of the registers using, e.g., a stored failure buss or as described herein, using LSSD scan of the registers to on or off chip facilities. The redundant element solution for failure relief of the memory array is then easily calculated using the "must fix" elemental repair first, and then a straightforward allocation of remaining elements for the remaining failures found within the memory array.

Figure 6:
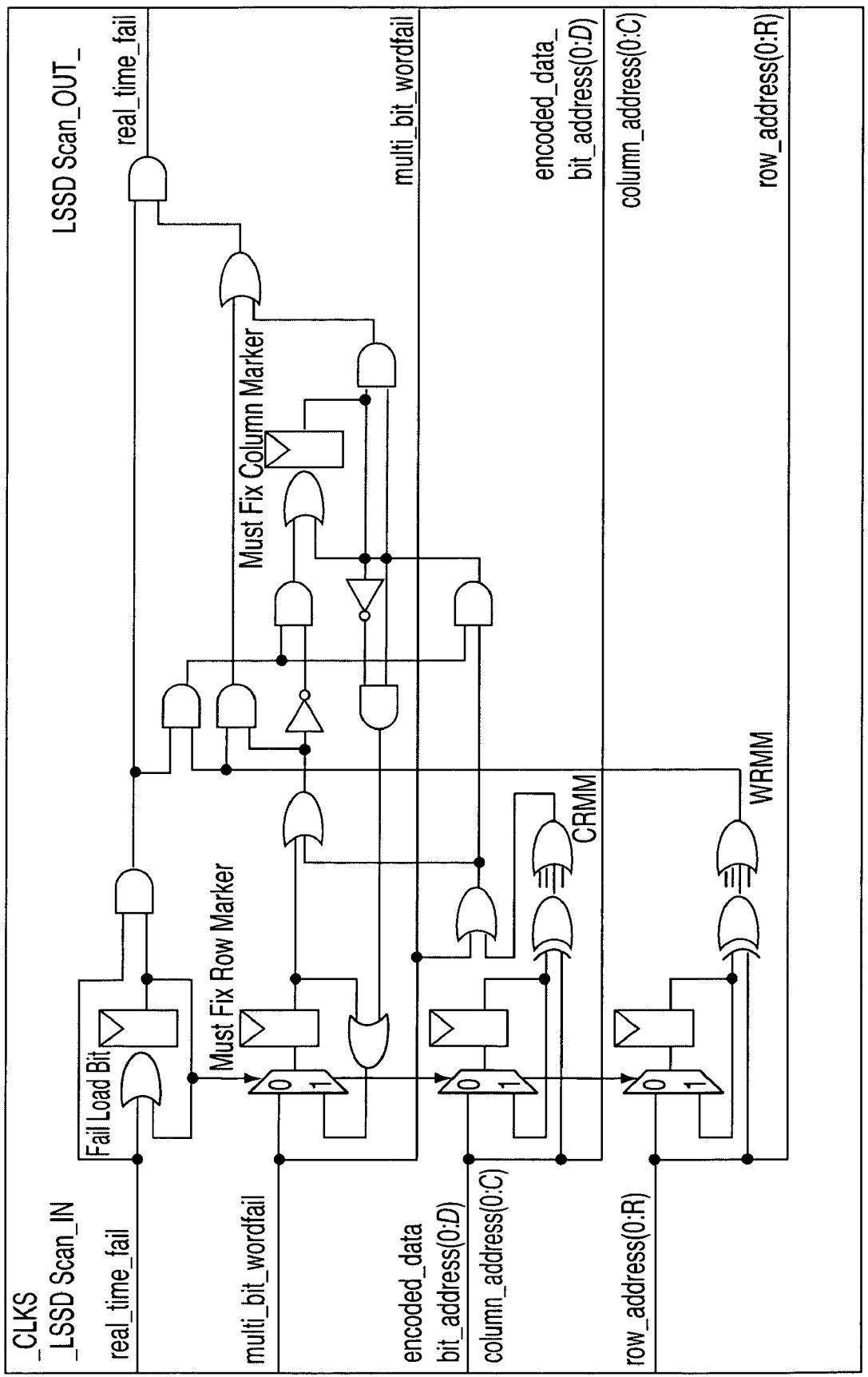
FIG. 6 illustrates the redundancy support register logic employed by the apparatus in exemplary embodiments.

Turning now to FIG. 6 shows a preferred embodiment implementation of the proposed redundancy support register module, including register storage elements for capture of failures within the memory array requiring relief, and redundancy allocation logic, providing for determination and storage of "must fix" row and column markers, and enablement of subsequent redundancy support registers as part of the allocation. This detail provided shows, but is not restricted to, a logic configuration providing exclusive markers for must fix row or column redundant elements, i.e., a must fix row marker set within the register module precludes the column marker from setting, and vice versa. If additional fails encountered within the memory array warrant storage of both a row and column element must fix repair, an additional redundancy support module will be used. It may also be desirable, but not required, to provide a logic configuration of the redundancy allocation logic within the module that allows both row and column must fix markers to set if such fails within the memory array are encountered, thereby more efficiently storing the necessary information for memory array failure relief within one redundancy support register module.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for providing flexible modular redundancy allocation for memory built in self test of random access memory with redundancy, the apparatus including:
    a first redundancy support register including:
        inputs for receiving an address of a location in memory under test and data relating to must fix repair elements, the address including a row vector and a column vector of the location; and
        outputs for transmitting the address and data; and
    a second redundancy support register including inputs for receiving the address and data from the outputs of the first redundancy support register, each of the inputs of the second redundancy support register having a one-to-one correspondence to each of the outputs of the first redundancy support register; and
    allocation logic for providing a modular implementation of the first redundancy support register and the second redundancy support register.

2. The apparatus of claim 1, wherein the data relating to the must fix repair elements includes a real time fail signal and at least one of:
    a must fix row marker; and
    a must fix column marker.

3. The apparatus of claim 2, wherein setting the must fix row marker indicates a row element repair is required.

4. The apparatus of claim 2, wherein setting the must fix column marker indicates a column element repair is required.

5. The apparatus of claim 2, wherein if neither the must fix row marker nor the must fix column marker are set during a course of testing, and the first redundancy support register or the second redundancy support register is loaded with an address entry relating to a failure occurring within the memory requiring relief, calculation of an overall redundancy repair solution of the memory is invoked without prior allocation to restrict subsequent failure relief within the memory.

6. The apparatus of claim 1, wherein the first redundancy support register and the second redundancy support register each include an input for receiving an encoded address of a failing data out resulting from execution of a compare function.

7. The apparatus of claim 1, wherein the allocation logic includes a first compare structure for manipulating the row vector and a second compare structure for manipulating the column vector.

8. The apparatus of claim 1, wherein the allocation logic provides diagnostic information regarding failure relief for memory under test.

9. A method for providing flexible modular redundancy allocation for memory built in self test of random access memory with redundancy, comprising:
    receiving, via inputs of a first redundancy support register, an address of a location in memory under test and data relating to must fix repair elements, the address including a row vector and a column vector of the location;
    transmitting the address and data to a second redundancy support register;
    receiving the address and data via inputs at the second redundancy support register, each of the inputs of the second redundancy support register having a one-to-one correspondence to each of the outputs of the first redundancy support register; and
    providing a modular implementation of the first redundancy support register and the second redundancy support register via allocation logic associated with the first redundancy support register and the second redundancy support register.

10. The method of claim 9, wherein the data relating to the must fix repair elements includes a real time fail signal and at least one of:
    a must fix row marker; and
    a must fix column marker.

11. The method of claim 10, wherein setting the must fix row marker indicates a row element repair is required.

12. The method of claim 10, wherein setting the must fix column marker indicates a column element repair is required.

13. The method of claim 10, wherein if neither the must fix row marker nor the must fix column marker are set during a course of testing, and the first redundancy support register or the second redundancy support register is loaded with an address entry relating to a failure occurring within the memory requiring relief, calculation of an overall redundancy repair solution of the memory is invoked without prior allocation to restrict subsequent failure relief within the memory.

14. The method of claim 9, wherein the first redundancy support register and the second redundancy support register each include an input for receiving an encoded address of a failing data out resulting from execution of a compare function.

15. The method of claim 9, wherein the allocation logic includes a first compare structure for manipulating the row vector and a second compare structure for manipulating the column vector.

16. The method of claim 9, wherein the allocation logic provides diagnostic information regarding failure relief for memory under test.

* * * * *